(12) United States Patent
Ham

(10) Patent No.: US 9,846,210 B2
(45) Date of Patent: Dec. 19, 2017

(54) GRADIENT COILS FOR CORRECTING HIGHER ORDER $B_0$ FIELD INHOMOGENEITIES IN MR IMAGING

(71) Applicant: KONINKLIJKE PHILIPS N.V., Eindhoven (NL)

(72) Inventor: Cornelis Leonardus Gerardus Ham, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 566 days.

(21) Appl. No.: 14/367,612

(22) PCT Filed: Dec. 11, 2012

(86) PCT No.: PCT/IB2012/057166
§ 371 (c)(1),
(2) Date: Jun. 20, 2014

(87) PCT Pub. No.: WO2013/093710
PCT Pub. Date: Jun. 27, 2013

(65) Prior Publication Data
US 2014/0333306 A1    Nov. 13, 2014

Related U.S. Application Data

(60) Provisional application No. 61/579,739, filed on Dec. 23, 2011.

(51) Int. Cl.
*G01V 3/00* (2006.01)
*G01R 33/3875* (2006.01)
*G01R 33/385* (2006.01)

(52) U.S. Cl.
CPC ....... *G01R 33/3875* (2013.01); *G01R 33/385* (2013.01)

(58) Field of Classification Search
CPC .................................................. G01R 33/3875
(Continued)

(56) References Cited

U.S. PATENT DOCUMENTS 5,345,178 A   9/1994  Manabe
5,592,091 A   1/1997  Manabe
(Continued)

FOREIGN PATENT DOCUMENTS

JP   11089816 A      4/1999
JP   2002291716 A    10/2002
WO   2009124873 A1   10/2009

OTHER PUBLICATIONS

Juchem, C. et al "Magnetic Field Modeling with a Set of Individual Localized Coils", Journal of Magnetic Resonance, vol. 204, No. 2, Jun. 2010.
(Continued)

*Primary Examiner* — Louis Arana

(57) ABSTRACT

A magnetic resonance apparatus corrects higher order $B_0$ magnetic field inhomogeneities in the examination volume of an MR device. Currents through two or more coil sections ($X_1$, $X_2$) of at least one of a plurality of gradient coils (4) are independently controlled in such a manner that higher order field inhomogeneities of the main magnetic field $B_0$ are compensated for by the magnetic field of the at least one gradient coil (4).

7 Claims, 2 Drawing Sheets

(58) Field of Classification Search
USPC .................................... 324/318, 319, 320
See application file for complete search history.

(56) References Cited

U.S. PATENT DOCUMENTS

| | | | |
|---|---|---|---|
| 5,614,827 A | | 3/1997 | Heid |
| 5,617,030 A | | 4/1997 | Fischer |
| 5,701,075 A | * | 12/1997 | Xu ..................... G01R 33/3875 324/318 |
| 5,867,027 A | | 2/1999 | Kawamoto |
| 6,064,208 A | | 5/2000 | Steckner |
| 6,392,412 B1 | | 5/2002 | Nauerth |
| 8,222,985 B2 | * | 7/2012 | Neuberth ........... G01R 33/3815 324/319 |
| 9,182,465 B2 | * | 11/2015 | Kimmlingen ........ G01R 33/381 |
| 2005/0110492 A1 | | 5/2005 | Watkins |
| 2013/0147476 A1 | * | 6/2013 | Shvartsman ....... G01R 33/3642 324/309 |

OTHER PUBLICATIONS

McAulay, Alastair D. "Numerical Method for Adjusting Magnetic Arrays for Medical NMR Imaging", IEEE Transactions on Magnetics, vol. MAG-19, Jan. 1983. pp. 2165-2167.

\* cited by examiner

US 9,846,210 B2

GRADIENT COILS FOR CORRECTING HIGHER ORDER $B_0$ FIELD INHOMOGENEITIES IN MR IMAGING

CROSS-REFERENCE TO PRIOR APPLICATIONS

This application is the U.S. National Phase application under 35 U.S.C. §371 of International Application No. PCT/IB2012/057166, filed on Dec. 11, 2012, which claims the benefit of U.S. Provisional Patent Application No. 61/579,739, filed on Dec. 23, 2011. These applications are hereby incorporated by reference herein.

FIELD OF THE INVENTION

The invention relates to the field of magnetic resonance (MR) imaging and spectroscopy. It concerns a method of correcting magnetic field inhomogeneities of a nearly homogeneous main magnetic field $B_0$ in an examination volume of a MR device. The invention also relates to a MR device and to a computer program to be run on a MR device.

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field $B_0$ extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to an MR image by means of Fourier transformation.

In MR imaging the uniformity of the main magnetic field $B_0$ is a critical factor. The necessary magnetic field homogeneity is achieved in the examination volume of the used MR device on the basis of an appropriate design of the main magnet in combination with stationary shim measures (e.g. ferromagnetic materials applied at suitable locations in or near the examination volume). In addition, a set of (first, second and—where applicable—third order) shimming coils, which further improve shimming of the main magnetic field, are activated during a MR imaging session by applying appropriate currents to the shimming coils.

In MR devices, which are in clinical use today, higher order shim systems comprising a set of five shimming coils are typically present. Such shim systems include a set of five amplifiers for applying the appropriate currents to the individual shimming coils and an interface to the back-end control electronics of the MR device. A drawback of such systems is their complexity and expensiveness.

From the foregoing it is readily appreciated that there is a need for an improved MR technique. It is consequently an object of the invention to provide a method that enables effective correction of higher order field inhomogeneities of the main magnetic field $B_0$.

In accordance with the invention, a method of correcting magnetic field inhomogeneities of a nearly homogeneous main magnetic field $B_0$ in an examination volume of a MR device is disclosed. The invention proposes that currents through two or more coil sections of at least one of a plurality of gradient coils are controlled in such a manner that higher order field inhomogeneities of the main magnetic field $B_0$ are compensated for by the magnetic field of the at least one gradient coil which is superimposed onto the main magnetic field $B_0$.

It is the gist of the invention to use the gradient coil system of a MR device for generating higher order spatial magnetic field distributions for shimming the main magnetic field $B_0$.

In accordance with the invention, up to three of the typically five channels of the shim system of the MR device can be omitted, because the corresponding higher order field inhomogeneities of the main magnetic field $B_0$ can be compensated for by the three gradient coils (x-, y- and z-gradients) that are present in the MR device anyway. Hence, the costs of the shim system of the MR device can be significantly reduced.

It is an insight of the invention that higher order magnetic field distributions can be generated by means of the gradient coils when (per se known) sectioned gradient coils are used. The currents through the different coil sections of the respective gradient coil of the MR device need to be controlled independently of each other in order to achieve the specified $B_0$ homogeneity. Generally, the currents flowing through one coil section of one of the gradient coils will differ from the current flowing through another coil section of the same gradient coil when the method of the invention is applied for higher order shimming of the main magnetic field $B_0$.

In a preferred embodiment, the method of the invention comprises the steps of:
 subjecting a portion of a body of a patient to an imaging sequence comprising RF pulses and switched magnetic field gradients;
 acquiring imaging signal data;
 reconstructing a MR image from the imaging signal data, wherein the currents through the coil sections of the gradient coils are controlled such that higher order field inhomogeneities of the main magnetic field $B_0$ are corrected during the imaging sequence and/or during acquisition of the imaging signal data.

The shimming approach of the invention can be applied during excitation of magnetic resonance as well as during acquisition of the MR imaging signal data from which the MR image is finally reconstructed. The method of the invention enables dynamic shimming because the currents applied to the different sections of the gradient coils can be individually controlled, for example depending on the shape of the examined body which generates a specific disturbance of the main magnetic field. It turns out in practice that the dominant field disturbances generated by the individually deferring patient body shapes can be compensated for by the higher order magnetic field distributions that are generated by the gradient coils according to the invention.

It is possible to measure the main magnetic field distribution by means of a calibration scan prior to the actual image acquisition. In accordance with the invention, the currents applied to the individual coil sections of the gradient coils can then be controlled on the basis of the acquired calibration signal data in order to achieve optimum main magnetic field homogeneity during image acquisition. Techniques for measuring the $B_0$ distribution within the examination volume are per se known in the art. Such known techniques can be used for determining the currents applied to the gradient coil sections for $B_0$ shimming according to the invention.

The method of the invention described thus far can be carried out by means of a MR device including at least one main magnet coil for generating a nearly homogeneous, steady magnetic field $B_0$ within an examination volume, a number of gradient coils for generating switched magnetic field gradients in different spatial directions within the examination volume, each gradient coil comprising two or more coil sections, at least one RF coil for generating RF pulses within the examination volume and/or for receiving MR signals from a body of a patient positioned in the examination volume, and a control unit for controlling the temporal succession of RF pulses and switched magnetic field gradients. According to the invention the currents flowing through the coil sections of each gradient coil are controllable independently of each other.

A computer program can be utilized by which the MR device is controlled such that it performs the above-explained method of the invention. The computer program may be present either on a data carrier or be present in a data network so as to be downloaded for installation in the control unit of the MR device.

The enclosed drawings disclose preferred embodiments of the present invention. It should be understood, however, that the drawings are designed for the purpose of illustration only and not as a definition of the limits of the invention. In the drawings:

DETAILED DESCRIPTION OF THE INVENTION

Figure 1:
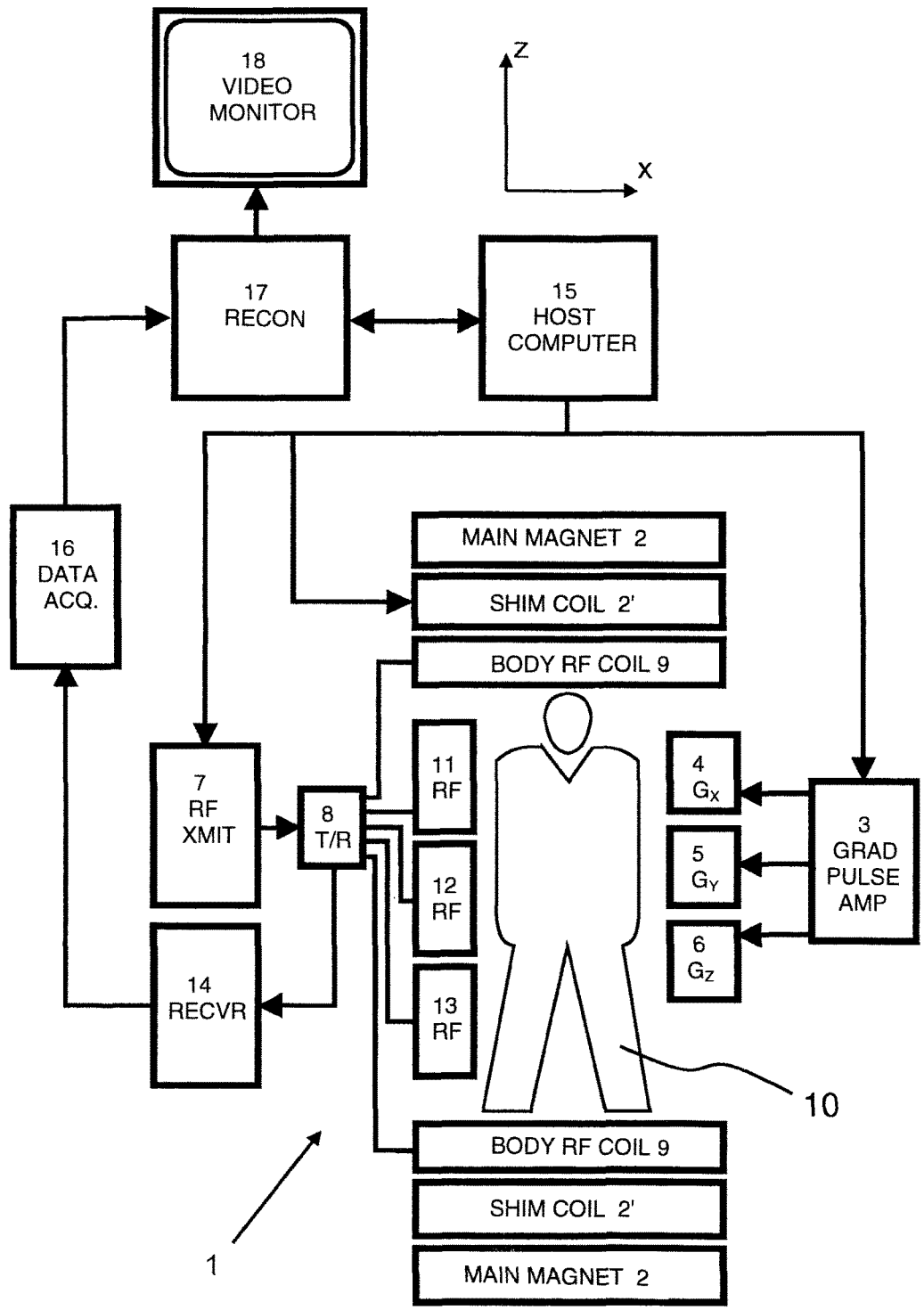
FIG. 1 shows a MR device for carrying out the method of the invention.

With reference to FIG. 1, a MR device 1 is shown. The device comprises superconducting or resistive main magnet coils 2 such that a nearly homogeneous, temporally constant main magnetic field $B_0$ is created along a z-axis through an examination volume. The device further comprises a set of ($1^{st}$, and—where applicable—$2^{nd}$ and $3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

Most specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms, such like SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

A first practical embodiment of the invention is described as follows with reference to FIG. 2.

Figure 2:
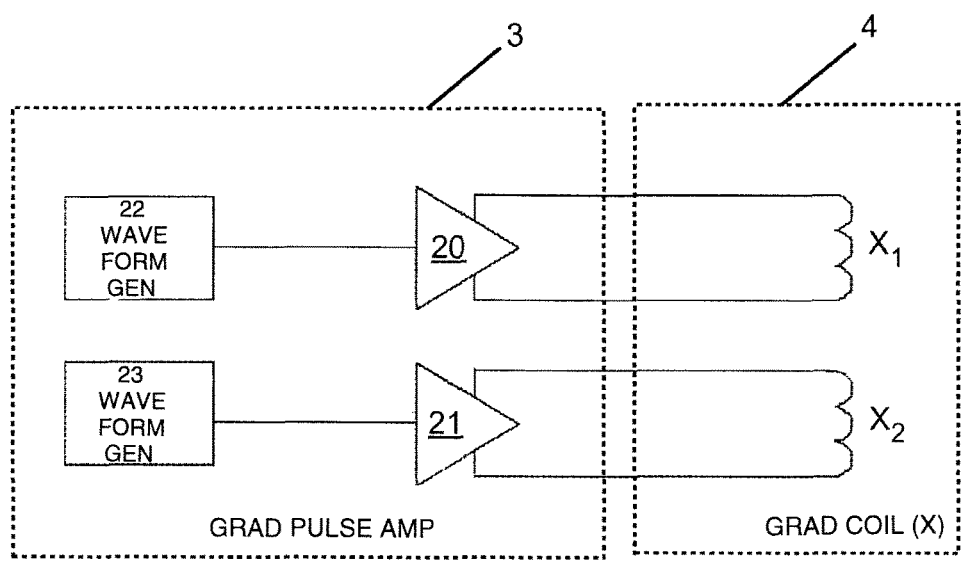
FIG. 2 schematically shows a gradient coil arrangement comprising coil sections according to a first embodiment of the invention.

FIG. 2 shows (a part of) the gradient pulse amplifier 3 and the gradient coil 4 of the MR device 1 in more detail. The gradient coil 4 is sectioned, which means that two coil sections $X_1$ and $X_2$ are present for generating a magnetic field gradient in the X-direction. Corresponding gradient coil halves $Y_1$, $Y_2$, $Z_1$ and $Z_2$ are present in the gradient coils 5 and 6, respectively. The currents through the coil sections $X_1$ and $X_2$ are applied by means of amplifiers (current sources) 20 and 21. Each amplifier 20, 21 is connected to one coil half $X_1$, $X_2$. The design of the gradient coil 4 as shown in FIG. 2 is realized in many MR devices in clinical use today. However, in known MR devices the amplifiers 20, 21 driving the sections $X_1$ and $X_2$ are driven simultaneously based on a single wave form generator per gradient axis X, Y, Z. In FIG. 2, in contrast, each amplifier 20, 21 is driven by an individual wave form generator 22, 23, respectively. In case only a static higher order field distribution needs to generated, the second wave form generator 23 can be simplified to a controllable DC current offset. This enables to control the currents flowing through the coil sections $X_1$ and $X_2$ of the gradient coil 4 independently of each other in accordance with the invention. Higher order spatial magnetic field distributions can be generated by means of the gradient coil 4 as shown in FIG. 2. The magnetic field of the gradient coil 4 is superimposed onto the main magnetic field $B_0$ within the examination volume of the MR device 1. By appropriate control of the currents flowing through the coil sections $X_1$ and $X_2$ via the wave form generators 22, 23, higher order shimming of the main magnetic field $B_0$ is achieved. When currents are flowing through the coil sections $X_1$ and $X_2$ such that a magnetic field gradient is generated, for example during an imaging sequence, a linear magnetic field gradient plus a certain amount of higher order field components (mainly $3^{rd}$ order) will be generated. By inverting the current in one of the coil sections $X_1$, $X_2$, a $B_0$ field (i.e. without linear gradient field) plus a higher order field distribution (mainly $2^{nd}$ order) will be generated by the gradient coil. This higher order spatial field distribution generated by the gradient coil can be used, as explained above, in a targeted manner for compensating for corresponding higher order field inhomogeneities of the main magnetic field $B_0$.

The afore-described technique can be applied on the other two gradient coils 5 and 6 as well. By using gradient coils 4, 5, 6 that are sectioned in an appropriate fashion (wherein the coil sections will generally be asymmetrically arranged with respect to the symmetry planes of the examination volume), the gradient system of the MR device 1 can produce $z^2$, $x^2$ and $y^2$ terms of the magnetic field distribution within the examination volume. This corresponds to Legendre coefficients $C_{20}$, $C_{21}$ and $S_{21}$ of a conventional shim system.

Figure 3:
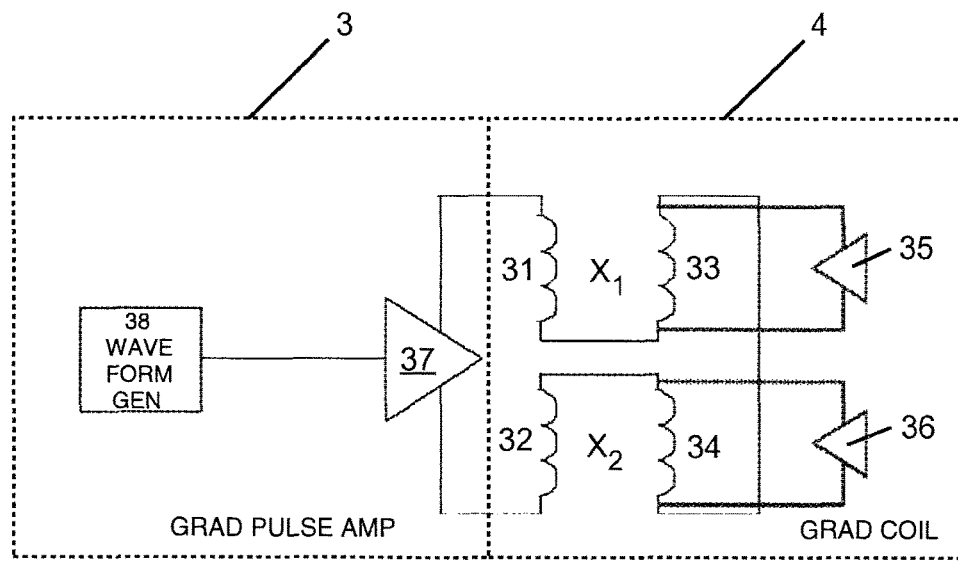
FIG. 3 schematically shows a shielded gradient coil arrangement according to a second embodiment of the invention.

An alternative practical embodiment of the invention is shown in FIG. 3. In FIG. 3, the coil halves $X_1$ and $X_2$ are subdivided into inner coil sections 31, 32, and outer coil sections 33 and 34 respectively. The outer coil sections 33, 34 are used for shielding the magnetic field generated by the inner coil sections 31, 32. The coil sections 31 and 33 are connected in series as well as the coil sections 32 and 34. The outer coil sections 33, 34 are connected with individual current sources 35, 36 controlling the current flowing through the outer coil sections 33, 34. The currents of the current sources 35, 36 are superimposed onto the currents generated by amplifier 37. Appropriate control of the current sources 35, 36 results in a higher order field pattern generated by the gradient coil 4 which can be used in accordance with the invention for shimming of the main magnetic field $B_0$. In the embodiment shown in FIG. 3, the amplifiers 35, 36 can be used for driving DC currents as constant offsets through the outer coil sections 33, 34 which are independent of the alternating currents generated by amplifier 37 (during gradient switching). In the embodiment of FIG. 3 only a single wave form generator 38 is required.

As illustrated in FIG. 3, it is generally possible in accordance with the invention that one or more of the coil sections $X_1$, $X_2$, 31, 32, 33, 34 is connected with a (DC driven) current source controlling the current flowing through the respective coil section independently of the current flowing through another coil section of the gradient coil 4. The currents generated by the corresponding current sources can be controlled individually, for example for the purpose of dynamic shimming.

The invention claimed is:

1. An MR device having functionality to correct magnetic field inhomogeneities of a nearly homogeneous main magnetic field $B_0$ in the MR devices examination volume, which MR device comprises at least one main magnet coil for generating the nearly homogeneous steady magnetic field $B_0$ within the examination volume, a number of gradient coils for generating switched magnetic field gradients in different spatial directions within the examination volume, each gradient coil comprising two or more coil sections ($X_1$, $X_2$), at least one body RF coil for generating RF pulses within the examination volume and/or for receiving MR signals from a body of a patient positioned in the examination volume, and a control unit for controlling the temporal succession of RF pulses and switched magnetic field gradients, wherein the currents flowing through the coil sections ($X_1$, $X_2$) of each gradient coil are controllable independently of each other, wherein each coil section ($X_1$ or $X_2$) is subdivided in an inner coil section and an outer coil section circuited in series and the MR device comprises
a waveform generator and an amplifier, the waveform generator's output being connected to the amplifier's input and the amplifier's output coupled to the inner coil section to apply an electrical current to the inner coil section and
individual current sources coupled to the respective outer coil sections to control an electrical current flowing through the outer coil sections of the respective coil sections.

2. The MR device of claim 1, wherein the individual current sources are configured for driving DC currents as constant offsets through the outer coil sections independently of the alternating currents generated by the amplifier.

3. The MR device of claim 1, wherein the coil sections are inner coil sections and outer coil sections of shielded gradient coils.

4. A magnetic resonance (MR) apparatus comprising:
a main magnet configured to generate a nearly homogeneous steady-state magnetic field ($B_0$) in an examination volume;
at least first and second gradient coils configured to generate magnetic field gradients across the examination volume in first and second spatial directions, respectively, the first gradient coil including:
at least two coil sections, each coil section being sub-divided into an inner coil section and an outer coil section, the inner and outer coil sections being connected in series;
at least one RF coil configured to transmit RF pulses into the examination volume and/or receive magnetic resonance echo signals from the examination region;
a waveform generator and a amplifier connected to an output of the first waveform generator, an output of the amplifier being coupled to the inner coil section;
a current source coupled to the outer coil section configured to apply electric currents to the outer coil section;
a host computer configured to control:
the at least one RF coil,
the waveform generator to apply an electric current to the inner coil section, and
the current source to control electrical currents applied to the outer coil segment.

5. The magnetic resonance apparatus of claim 4, wherein the waveform generator is configured to apply gradient pulses, under control of the host processor, to the inner coil section.

6. The magnetic resonance apparatus of claim 5, wherein the current source is configured to apply a DC current through the outer coil section independently of the gradient pulses applied to the inner coil section.

7. The magnetic resonance apparatus of claim 4, wherein the outer coil section shields magnetic fields generated by the inner coil section.

\* \* \* \* \*